United States Patent [19]
Nagata et al.

[11] Patent Number: 5,910,736
[45] Date of Patent: Jun. 8, 1999

[54] DIFFERENTIAL-TYPE DATA TRANSMITTER

[75] Inventors: Junichi Nagata; Junji Hayakawa, both of Okazaki, Japan

[73] Assignee: Denso Corporation, Kariya, Japan

[21] Appl. No.: 08/733,636

[22] Filed: Oct. 17, 1996

[30] Foreign Application Priority Data

Oct. 17, 1995 [JP] Japan ................................. 7-268458

[51] Int. Cl.$^6$ ............................ H03K 19/086; H03F 3/45
[52] U.S. Cl. ............................ 326/126; 326/22; 326/31; 327/52; 327/563; 330/2; 330/258
[58] Field of Search ................................. 326/126–127, 326/22, 31–33, 64, 68, 75; 327/52, 65, 563, 310; 330/2, 252, 258

[56] References Cited

U.S. PATENT DOCUMENTS

| | | | |
|---|---|---|---|
| 3,582,802 | 6/1971 | Weekes et al. | 330/258 |
| 5,294,893 | 3/1994 | Ryat | 330/258 |
| 5,298,809 | 3/1994 | Yamaguchi | 330/258 |
| 5,420,550 | 5/1995 | May | 330/258 |

FOREIGN PATENT DOCUMENTS 6-164336  6/1994  Japan .

*Primary Examiner*—Jon Santamauro
*Attorney, Agent, or Firm*—Pillsbury Madison & Sutro LLP

[57] ABSTRACT

A differential-type data transmitter includes a differential amplifier pair (T1, T2, T4, T6, T8) having a plurality of transistors and receiving a pair of a first input signal and a second input signal. A load (T3, T5, T7) is connected to the differential amplifier pair. A detection circuit (T9, T10, I4, I5, I6, I7) connected to a junction between the differential amplifier pair and the load is operative for detecting whether or not the first and second input signals are outside a common-mode input voltage range with respect to the differential amplifier pair. A first output circuit (T12) connected to the detection circuit is operative for outputting a signal depending on an output signal from the differential amplifier pair. The signal outputted from the first output circuit is set to a given level when the detection circuit detects that the first and second input signals are outside the conmmon-mode input voltage range. A second output circuit (T11) connected to the detection circuit is operative for outputting a detection signal representing whether or not the detection circuit detects that the first and second input signals are outside the common-mode input voltage range.

7 Claims, 3 Drawing Sheets

DIFFERENTIAL-TYPE DATA TRANSMITTER

BACKGROUND OF THE INVENTION

1. Field of the Invention

This invention relates to a data transmitter including a differential amplifier.

2. Description of the Prior Art

Japanese published unexamined patent application 6-164336 discloses a differential-type data transmitter applicable to a balanced transmission system for defining an output expectation value in a condition where input voltages to a differential amplifier exceed a common-mode input voltage range.

In the data transmitter of Japanese application 6-164336, a differential amplifier or a differential amplifier pair having two input terminals is composed of four transistors. A current mirror circuit formed by two transistors is connected to the differential amplifier as a load. A junction between the differential amplifier and the current mirror circuit is successively followed by output transistors. Constant currents are fed to the transistors in the differential amplifier respectively.

SUMMARY OF THE INVENTION

It is an object of this invention to provide an improved differential-type data transmitter.

A first aspect of this invention provides a differential-type data transmitter comprising a differential amplifier pair (T1, T2, T4, T6, T8) including a plurality of transistors and receiving a pair of a first input signal and a second input signal; a load (T3, T5, T7) connected to the differential amplifier pair; detection means (T9, T10, I4, I5, I6, I7) connected to a Junction between the differential amplifier pair and the load for detecting whether or not the first and second input signals are outside a common-mode input voltage range with respect to the differential amplifier pair; first output means (T12) connected to the detection means for outputting a signal depending on an output signal from the differential amplifier pair, wherein the signal outputted from the first output means is set to a given level when the detection means detects that the first and second input signals are outside the common-mode input voltage range; and second output means (T11) connected to the detection means for outputting a detection signal representing whether or not the detection means detects that the first and second input signals are outside the common-mode input voltage range.

A second aspect of this invention is based on the first aspect thereof, and provides a differential-type data transmitter wherein the detection means comprises a first detecting portion (I4, T10, I7) connected to the first output means; and a second detecting portion (I5, T9, I6) connected to the second output means; wherein the first and second detecting portions output signals which are inverted with respect to each other when the first and second detecting portions detect that the first and second input signals are outside the common-mode input voltage range.

A third aspect of this invention is based on the second aspect thereof, and provides a differential-type data transmitter further comprising a first transistor (T2) having a control terminal controlled by the first input signal, and a first output terminal and a second output terminal conduction-controlled by the control terminal thereof; a second transistor (T6) having a control terminal controlled by the second input signal, and a first output terminal and a second output terminal conduction-controlled by the control terminal thereof: a first load (T3) connected to the second output terminal of the first transistor; a second load (T7) connected to the second output terminal of the second transistor; a third transistor (T4) having a control terminal controlled by the second input signal, and a first output terminal and a second output terminal conduction-controlled by the control terminal thereof, wherein the first output terminal of the third transistor is connected to the first output terminal of the first transistor, and the control terminal of the third transistor is subjected to a signal depending on the second input signal; and a third load (T5) connected to the second output terminal of the third transistor; wherein the first detecting portion is connected to a junction between the second output terminal of the second transistor and the second load, and the second detecting portion is connected to a junction between the second output terminal of the third transistor and the third load.

A fourth aspect of this invention is based on the third aspect thereof, and provides a differential-type data transmitter wherein the first detecting portion includes a first detection transistor (T10) having a control terminal and two output terminals conduction-controlled by the control terminal thereof; the second detecting portion includes a second detection transistor (T9) having a control terminal and two output terminals conduction-controlled by the control terminal thereof; the control terminal of the first detection transistor is connected to a junction between the second output terminal of the second transistor and the second load; the control terminal of the first detection transistor is connected to one end of a first constant-current circuit having another end connected to a high voltage power-supply terminal; the first output means is controlled by an output signal from the first detection transistor; the control terminal of the second detection transistor is connected to a junction between the second output terminal of the third transistor and the third load; the control terminal of the second detection transistor is connected to one end of a second constant-current circuit having another end connected to a low voltage power-supply terminal; the second output means is controlled by an output signal from the second detection transistor; the first detecting portion is operative for detecting that the first input signal and the second input signal are outside the common-mode input voltage range in cases where a voltage at the control terminal of the first detection transistor is determined by only a current of the first constant-current circuit; and the second detecting portion is operative for detecting that the first input signal and the second input signal are outside the common-mode input voltage range in cases where a voltage at the control terminal of the second detection transistor is determined by only a current of the second constant-current circuit.

A fifth aspect of this invention provides a differential-type data transmitter comprising a first differential amplifier pair (T3A, T4A) including a plurality of transistors and being controlled by a first input signal and a second input signal; a second differential amplifier pair (T2A, T5A) including a plurality of transistors and being controlled by the first input signal and the second input signal; a load connected to the first differential amplifier pair; first detection means (T9A) connected to a junction between the first differential amplifier pair for detecting the first differential amplifier pair is in an active state or an inactive state; second detection means (T11A) connected to a junction between the second differential amplifier for detecting the second differential amplifier pair is in an active state or an inactive state; first output means (T10A) connected to the first detection means for outputting a signal depending on an output signal from the first differential amplifier pair, wherein the signal outputted from the first output means is set to a given level when the first detection means detects that the first differential amplifier pair is in the inactive state; and second output means (T12A) connected to the second detection means for outputting a signal depending on an output signal from the second differential amplifier pair, wherein the signal outputted from the second output means is set to a given level when the second detection means detects that the second differential amplifier pair is in the inactive state.

A sixth aspect of this invention is based on the fifth aspect thereof, and provides a differential-type data transmitter wherein the second detection means comprises a constant-current circuit, and the second detection means detects that the second differential amplifier pair is in the inactive state in response to a difference between a current of the constant current circuit and a current caused by the second differential amplifier pair.

A seventh aspect of this invention provides a differential-type data transmitter comprising a differential amplifier responding to a first input signal and a second input signal; first means connected to the differential amplifier for generating a first output signal in response to the first and second input signals; and second means connected to the differential amplifier for generating a second output signal in response to the first and second input signals; wherein a logic state of the first output signal and a logic state of the second output signal are equal to each other and depend on a difference between the first and second input signals when the first and second input signals are in a given voltage range; and wherein the logic state of the first output signal and the logic state of the second output signal are different from each other when the first and second input signals are outside the given voltage range.

An eighth aspect of this invention provides a differential-type data transmitter comprising a differential amplifier responding to a first input signal and a second input signal; first means connected to the differential amplifier for generating a first output signal in response to the first and second input signals, the first output signal having a logic state which depends on a difference between the first and second input signals; and second means connected to the differential amplifier for generating a second output signal in response to the first and second input signals, the second output signal having a logic state which depends on whether or not the first and second input signals are in a given voltage range.

DESCRIPTION OF THE PREFERRED EMBODIMENTS

First Embodiment

Figure 1:
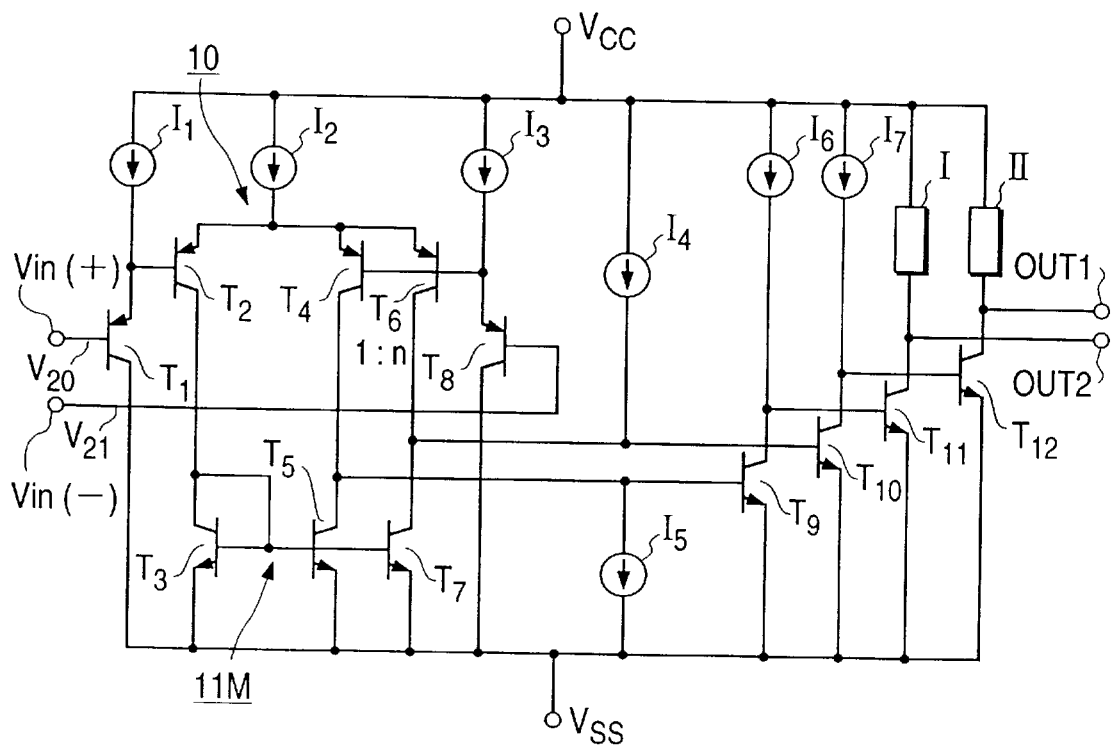
FIG. 1 is a schematic diagram of a data transmitter according to a first embodiment of this invention.

With reference to FIG. 1, a data transmitter includes a differential amplifier (a differential amplifier pair) 10 which has a pair of first and second sections. The first section of the differential amplifier 10 includes PNP transistors T1 and T2. The second section of the differential amplifier 10 includes PNP transistors T4, T6, and T8. The data transmitter of FIG. 1 is provided with NPN transistors T3, T5, and T7.

The collector of the transistor T2 is connected to the collector of the transistor T3. The collector of the transistor T4 is connected to the collector of the transistor T5. The collector of the transistor T6 is connected to the collector of the transistor T7. The collector of the transistor T3 is connected to the base thereof. The collector of the transistor T3 is also connected to the bases of the transistors T5 and T7.

The emitters of the transistors T3, T5, and T7 are connected to a power-supply ground line subjected to a ground potential Vss. The transistors T3, T5, and T7 compose a current mirror circuit 11M. The current mirror circuit 11M is connected to the differential amplifier 10 as a load.

The emitter of the transistor T1 is connected via a constant-current source (a current regulator) I1 to a positive power-supply line subjected to a positive power-supply voltage Vcc. The emitter of the transistor T8 is connected via a constant-current source (a current regulator) I3 to the positive power-supply line. The collectors of the transistors T1 and T8 are connected to the power-supply ground line subjected to the ground potential Vss.

The emitters of the transistors T2, T4, and T6 are connected in common. The emitters of the transistors T2, T4, and T6 are connected via a constant-current source (a current regulator) I2 to the positive power-supply line subjected to the positive power-supply voltage Vcc.

The emitter of the transistor T1 is connected to the base of the transistor T2. The emitter of the transistor T8 is connected to the bases of the transistors T4 and T6.

The data transmitter of FIG. 1 includes a pair of differential input terminals Vin(+) and Vin(−) connected to the bases of the transistors T1 and T8 in the differential amplifier 10 respectively.

Furthermore, the data transmitter of FIG. 1 includes NPN transistors T9, T10, T11, and T12. A junction between the collector of the transistor T4 in the differential amplifier 10 and the collector of the transistor T5 in the current mirror circuit 11M is connected to the base of the transistor T9. The collector of the transistor T9 is connected to the base of the transistor T11. Also, the collector of the transistor T9 is connected via a constant-current source (a current regulator) I6 to the positive power-supply line subjected to the positive power-supply voltage Vcc. The emitters of the transistors T9 and T11 are connected to the power-supply ground line subjected to the ground potential Vss.

A junction between the collector of the transistor T6 in the differential amplifier 10 and the collector of the transistor T7 in the current mirror circuit 11M is connected to the base of the transistor T10. The collector of the transistor T10 is connected to the base of the transistor T12. Also, the collector of the transistor T10 is connected via a constant-current source (a current regulator) I7 to the positive power-supply line subjected to the positive power-supply voltage Vcc. The emitters of the transistors T10 and T12 are connected to the power-supply ground line subjected to the ground potential Vss.

The collector of the transistor T11 is connected via an element I to the positive power-supply line subjected to the positive power-supply voltage Vcc. The collector of the transistor T12 is connected via an element II to the positive power-supply line. Each of the elements I and II includes, for example, a resistor or a constant-current source (a current regulator).

The collector of the transistor T12 is connected to a first output terminal OUT1 at which a binary output signal changeable between a high-level state and a low-level state appears. The collector of the transistor T11 is connected to a second output terminal OUT2 at which a binary output signal changeable between a high-level state and a low-level state appears.

The base of the transistor T9 is connected via a constant-current source (a current regulator) I5 to the power-supply ground line subjected to the ground potential Vss. The base of the transistor T10 is connected via a constant-current source (a current regulator) I4 to the positive power-supply line subjected to the positive power-supply voltage Vcc.

The constant-current sources I2, I4, and I7 are designed to satisfy the following relations.

$$I4 \cdot \beta_{T10} > I7$$

$$I4 < I2 \tag{1}$$

where "I2" denotes the current outputted from the constant-current source I2; "I4" denotes the current outputted from the constant-current source I4; "I7" denotes the current outputted from the constant-current source I7; and "$\beta_{T10}$" denotes a current-amplification factor of the transistor T10 as a grounded-emitter amplifier.

The transistors T4 and T6 in the differential amplifier 10 compose a current mirror circuit which has a mirror ratio "1:n".

The constant-current sources I2, I5, and I6 are designed to satisfy the following relation.

$$I2\{1/(1+n)\} - I5 > I6/\beta_{T9} \tag{2}$$

where "I2" denotes the current outputted from the constant-current source I2; "I5" denotes the current inputted into or flowing through the constant-current source I5; "I6" denotes the current outputted from the constant-current source I6; and "$\beta_{T9}$" denotes a current-amplification factor of the transistor T9 as a grounded-emitter amplifier.

A maximum common-mode input voltage $V_{ICMMAX}$ applied to each of the differential input terminals Vin(+) and Vin(−) is approximately expressed as follows.

$$V_{ICMMAX} \approx Vcc - V_{I2} - V_{BET2} - V_{BET1} \tag{3}$$

where "$V_{I2}$" denotes the voltage across the constant-current source I2; "$V_{BET1}$" denotes the normal-direction bias voltage between the base and the emitter of the transistor T1; and "$V_{BET2}$" denotes the normal-direction bias voltage between the base and the emitter of the transistor T2.

In the case where the constant-current source I2 uses a PNP transistor, the equation (3) is changed into the following version.

$$V_{ICMMAX} \approx Vcc - Vsatpnp - V_{BET2} - V_{BET1} \tag{4}$$

where "Vsatpnp" denotes the saturation voltage between the collector and the emitter of the PNP transistor in the constant-current source I2.

It is now assumed that a voltage $V_{ICM1}$ which exceeds the maxium voltage $V_{ICMMAX}$ by a voltage Vα is applied to each of the input terminals Vin(+) and Vin(−). In this case, the base voltage $V_{BT2}$ of the transistor T2 is expressed as follows.

$$V_{BT2} = V20 + V_{BET1} \tag{5}$$

$$= V_{ICM1} + V_{BET1}$$

$$= V_{ICMMAX} + V\alpha + V_{BET1}$$

$$= Vcc - Vsatpnp - V_{BET2} - V_{BET1} + V\alpha + V_{BET1}$$

$$= Vcc - Vsatpnp - V_{BET2} + V\alpha$$

where "V20" denotes the voltage at the input terminal Vin(+). The emitter voltage $V_{ET2}$ of the transistors T2, T4, and T6 in the differential amplifier 10 is expressed as follows.

$$V_{ET2} = Vcc - Vsatpnp \tag{6}$$

The equations (5) and (6) indicate the following matter. In the case where the input voltage applied to each of the input terminals Vin(+) and Vin(−) exceeds a common-mode input voltage range (a given input voltage range or a normal input voltage range) whose upper limit equals the maximum voltage $V_{ICMMAX}$, the voltage $V_{BET2}'$ between the base and the emitter of the transistor T2 is expressed by the following equations.

$$V_{BET2}' = V_{ET2} - V_{BT2} \tag{7}$$

$$= V_{BET2} - V\alpha < V_{BET2}$$

Equations similar to the equations (7) stand good for the transistors T4 and T6. The equations (7) and the similar equations show that the voltage between the base and the emitter of each of the transistors T2, T4, and T6 in the differential amplifier 10 disagrees with a normal bias when common-mode input voltages higher than the maximum voltage $V_{ICMMAX}$ are applied to the input terminals Vin(+) and Vin(−). Accordingly, in this case, the transistors T2, T4, and T6 fall into off states or non-conductive states. Thus, the current mirror circuit 11M composed of the transistors T3, T5, and T7 is not supplied with currents, and the transistors T4, T5, T6, and T7 fall into off states (non-conductive states). Since the transistor T7 is in the off state, the whole of the current outputted from the constant-current source I4 is directed to the base of the transistor T10.

Since the output current from the constant-current source I4 which is multiplied by the current-amplification factor $\beta_{T10}$ of the transistor T10 is greater than the current outputted from the constant-current source I7, the resultant base current of the transistor T10 enables the collector-emitter path of the transistor T10 to be conductive. Accordingly, in this case, the transistor T12 falls into an off state (a non-conductive state). Thus, the base current of the transistor T10 causes the voltage at the first output terminal OUT1 to assume a high-level state. In summary, a high-level output signal is transmitted via the first output terminal OUT1 in response to input voltages exceeding the common-mode input voltage range.

On the other hand, the constant-current source I5 determines the base voltage of the transistor T9. In the case where the constant-current source I5 uses an NPN transistor, the voltage $V_{BET9}'$ between the base and the emitter of the transistor T9 is expressed as follows.

$$V_{BET9}' = Vsatnpn < V_{BET9} \tag{8}$$

where "Vsatnpn" denotes the saturation voltage between the collector and the emitter of the NPN transistor in the constant-current source I5, and "$V_{BET9}$" denotes the normal-direction bias voltage between the base and the emitter of the transistor T9.

The equation (8) shows that the voltage between the base and the emitter of the transistor T9 is smaller than the normal-direction bias voltage between the base and the emitter thereof, and hence the transistor T9 falls into an off state or a non-conductive state. The transistor T11 is in an on state (a conductive state) when the transistor T9 is in the off state (the non-conductive state). Accordingly, in this case, the voltage at the second output terminal OUT2 assumes a low-level state. In summary, a low-level output signal is transmitted via the second output terminal OUT2 in response to input voltages exceeding the common-mode input voltage range.

It is now assumed that input voltages applied to the input terminals Vin(+) and Vin(−) are in the common-mode input voltage range. In this case, the base voltage $V_{BT2}$ of the transistor T2 and the base voltage $V_{BT4}$ of the transistor T4 are expressed as follows.

$$V_{BT2} = V20 + V_{BET1}$$

$$V_{BT4} = V21 + V_{BET8} \quad (9)$$

where "V21" denotes the voltage at the input terminal Vin(−), and "$V_{BET8}$" denotes the normal-direction bias voltage between the base and the emitter of the transistor T8.

Since the emitters of the transistors T2 and T4 are connected in common, the emitter voltages of the transistors T2 and T4 are the same. Thus, the voltage $V_{BET2}'$ between the base and the emitter of the transistor T2 and the voltage $V_{BET4}'$ between the base and the emitter of the transistor T4 have a relation as follows.

$$V_{BET2}' - V_{BET4}' = V21 - V20 + V_{BET8} - V_{BET1} \quad (10)$$

When the input voltages are in the common-mode input voltage range, base currents generally flow in the transistors T1 and T8 and the base-emitter normal-direction bias voltages $V_{BET1}$ and $V_{BET8}$ of the transistors T1 and T8 are substantially the same. Thus, the equation (10) is simplified into the following version.

$$V_{BET2}' - V_{BET4}' = V21 - V20 \quad (11)$$

It is now assumed that the voltage at the input terminal Vin(+) is greater than the voltage at the input terminal Vin(−), that is, V21−V20<0. In this case, the following relation is satisfied.

$$V_{BET2}' > V_{BET4}' \quad (12)$$

The relation (12) means that the transistor T2 assumes an on state (a conductive state) while the transistor T4 assumes an off state (a non-conductive state). Also, the transistor T6 which forms a current mirror in conjunction with the transistor T4 assumes an off state (a non-conductive state). Since the transistor T2 assumes the on state while the transistors T4 and T6 are in the off states, approximately the whole of the output current from the constant-current source I2 is directed to the collector of the transistor T3 as a collector current. As expressed in the equation (1), the output current from the constant-current source I4 is smaller than the output current from the constant-current source I2. Accordingly, the voltage $V_{BET9}'$ between the base and the emitter of the transistor T9 and the voltage $V_{BET10}'$ between the base and the emitter of the transistor T10 are expressed as follows.

$$V_{BET9}' = Vsatnpn < V_{BET9}$$

$$V_{BET10}' = Vsatnpn < V_{BET10} \quad (13)$$

where "Vsatnpn" denotes NPN transistor's saturation voltage; "$V_{BET9}$" denotes the normal-direction bias voltage between the base and the emitter of the transistor T9; and "$V_{BET10}$" denotes the normal-direction bias voltage between the base and the emitter of the transistor T10.

The equations (13) show that the voltage between the base and the emitter of the transistor T9 is smaller than the normal-direction bias voltage between the base and the emitter thereof, and hence the transistor T9 falls into the off state or the non-conductive state. The transistor T11 is in the on state (the conductive state) when the transistor T9 is in the off state (the non-conductive state). Accordingly, in this case, the voltage at the second output terminal OUT2 assumes the low-level state. In addition, the equations (13) show that the voltage between the base and the emitter of the transistor T10 is smaller than the normal-direction bias voltage between the base and the emitter thereof, and hence the transistor T10 falls into the off state or the non-conductive state. The transistor T12 is in the on state (the conductive state) when the transistor T10 is in the off state (the non-conductive state). Accordingly, in this case, the voltage at the first output terminal OUT1 assumes the low-level state. In summary, low-level output signals are transmitted via the first and second output terminals OUT1 and OUT2 in response to the input voltages which are within the common-mode input voltage range, and which have the previously-indicated greatness/smallness relation.

It is now assumed that the voltage at the input terminal Vin(−) is greater than the voltage at the input terminal Vin(+), that is, V20−V21<0. In this case, the following relation is satisfied.

$$V_{BET2}' < V_{BET4}'$$

This relation means that the transistor T4 assumes an on state (a conductive state) while the transistor T2 assumes an off state (a non-conductive state). Also, the transistor T6 which forms a current mirror in conjunction with the transistor T4 assumes an on state (a conductive state). Since the transistor T2 assumes the off state, a collector current is not supplied to the transistor T3. Accordingly, the transistors T5 and T7 which form the current mirror in conjunction with the transistor T3 fall into off states (non-conductive states). Thus, the base current $I_{BT9}$ of the transistor T9 and the base current $I_{BT10}$ of the transistor T10 are expressed as follows.

$$I_{BT9} = I2\{1/(1+n)\} - I5$$

$$I_{BT10} = I2\{n/(1+n)\} + I4 \quad (14)$$

As indicated in the equation (2), $I2\{1/(1+n)\} - I5 > I6/\beta_{T9}$. Thus, the transistor T9 falls into the on state (the conductive state). It is understood from the equations (1) and (14) that the base current $I_{BT10}$ of the transistor T10 causes the transistor T10 to assume the on state (the conductive state). The transistor T11 is in the off state (the non-conductive state) when the transistor T9 is in the on state (the conductive state). Accordingly, in this case, the voltage at the second output terminal OUT2 assumes the high-level state. The transistor T12 is in the off state (the non-conductive state) when the transistor T10 is in the on state (the conductive state). Accordingly, in this case, the voltage at the first output terminal OUT1 assumes the high-level state. In summary, high-level output signals are transmitted via the first and second output terminals OUT1 and OUT2 in response to the input voltages which are within the common-mode input voltage range, and which have the previously-indicated greatness/smallness relation.

As previously described, voltages at the first and second output terminals OUT1 and OUT2 have opposite logic levels respectively when input voltages applied to the input terminals Vin(+) and Vin(−) exceed the common-mode input voltage range. On the other hand, voltages at the first and second output terminals OUT1 and OUT2 have equal logic levels respectively when input voltages applied to the input terminals Vin(+) and Vin(−) are in the common-mode input voltage range. In this case, the voltages at the first and second output terminals OUT1 and OUT2 are in the low-level states when the input voltage to the input terminal Vin(+) is greater than the input voltage to the input terminal Vin(−). The voltages at the first and second output terminals OUT1 and OUT2 are in the high-level states when the input voltage to the input terminal Vin(−) is greater than the input voltage to the input terminal Vin(+).

A suitable device such as a logic-state comparator may be provided to monitor the logic states of the output signals transmitted via the first and second output terminals OUT1 and OUT2. By referring to the monitored logic states of the output signals, it is possible to detect a malfunction of the transmission line such as a break of the transmission line.

Second Embodiment

Figure 2:
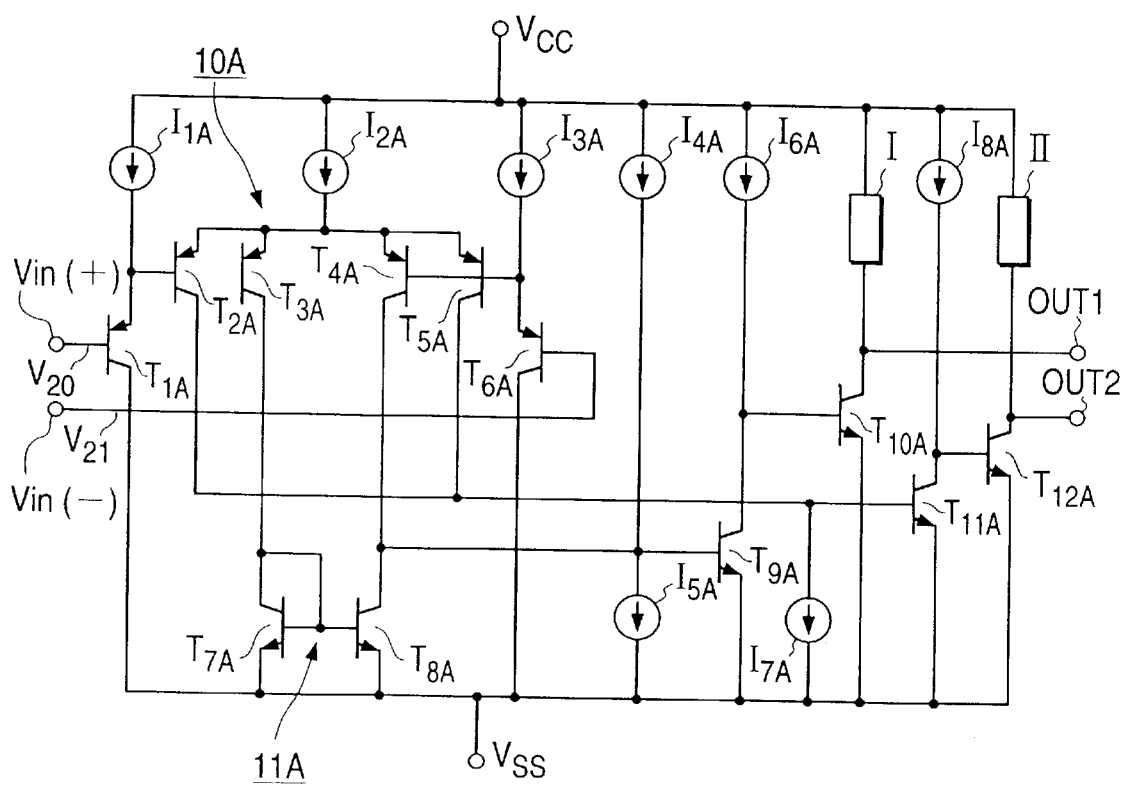
FIG. 2 is a schematic diagram of a data transmitter according to a second embodiment of this invention.

With reference to FIG. 2, a data transmitter includes a differential amplifier (a differential amplifier pair) 10A which has a pair of first and second sections. The first section of the differential amplifier 10A includes PNP transistors T1A and T3A. The second section of the differential amplifier 10A includes PNP transistors T4A and T6A. The data transmitter of FIG. 2 is provided with NPN transistors T7A and T8A.

The collector of the transistor T3A is connected to the collector of the transistor T7A. The collector of the transistor T4A is connected to the collector of the transistor T8A. The collector of the transistor T7A is connected to the base thereof. The collector of the transistor T7A is also connected to the bases of the transistor T8A.

The emitters of the transistors T7A and T8A are connected to a power-supply ground line subjected to a ground potential Vss.

The transistors T7A and T8A compose a current mirror circuit 11A. The current mirror circuit 11A is connected to the differential amplifier 10A as a load.

The emitter of the transistor T1A is connected via a constant-current source (a current regulator) I1A to a positive power-supply line subjected to a positive power-supply voltage Vcc. The emitter of the transistor T6A is connected via a constant-current source (a current regulator) I3A to the positive power-supply line. The collectors of the transistors T1A and T6A are connected to the power-supply ground line subjected to the ground potential Vss.

The emitters of the transistors T3A and T4A are connected in common. The emitters of the transistors T3A and T4A are connected via a constant-current source (a current regulator) I2A to the positive power-supply line subjected to the positive power-supply voltage Vcc.

The emitter of the transistor T1A is connected to the base of the transistor T3A. The emitter The emitter of the transistor T6A is connected to the bases of the transistor T4A.

The data transmitter of FIG. 2 includes a pair of differential input terminals Vin(+) and Vin(−) connected to the bases of the transistors T1A and T6A in the differential amplifier 10A respectively.

Furthermore, the data transmitter of FIG. 2 includes NPN transistors T9A, T10A, T11A, and T12A. A junction between the collector of the transistor T4 in the differential amplifier 10A and the collector of the transistor T8A in the current mirror circuit 11A is connected to the base of the transistor T9A. The collector of the transistor T9A is connected to the base of the transistor T10A. Also, the collector of the transistor T9A is connected via a constant-current source (a current regulator) I6A to the positive power-supply line subjected to the positive power-supply voltage Vcc. The emitters of the transistors T9A and T10A are connected to the power-supply ground line subjected to the ground potential Vss.

In addition, the data transmitter of FIG. 2 includes PNP transistors T2A and T5A. The base and the emitter of the transistor T3A in the differential amplifier 10A are connected to the base and the emitter of the transistor T2A respectively. The base and the emitter of the transistor T4A in the differential amplifier 10A are connected to the base and the emitter of the transistor T5A respectively.

The collectors of the transistors T2A and T5A are connected in common. The collectors of the transistors T2A and T5A are connected to the base of the transistor T11A.

The base of the transistor T11A is connected via a constant-current source (a current regulator) I7A to the power-supply ground line subjected to the ground potential Vss. The emitter of the transistor T11A is directly connected to the power-supply ground line. The collector of the transistor T11A is connected to the base of the transistor T12A. Also, the collector of the transistor T11A is connected via a constant-current source (a current regulator) I8A to the positive power-supply line subjected to the positive power-supply voltage Vcc.

The collector of the transistor T10A is connected via an element I to the positive power-supply line subjected to the positive power-supply voltage Vcc. The collector of the transistor T12A is connected via an element II to the positive power-supply line. Each of the elements I and II includes, for example, a resistor or a constant-current source (a current regulator).

The collector of the transistor T10A is connected to a first output terminal OUT1 at which a binary output signal changeable between a high-level state and a low-level state appears. The collector of the transistor T12A is connected to a second output terminal OUT2 at which a binary output signal changeable between a high-level state and a low-level state appears.

The base of the transistor T9A is connected via a constant-current source (a current regulator) I4A to the positive power-supply line subjected to the positive power-supply voltage Vcc. Also, the base of the transistor T9A is connected via a constant-current source (a current regulator) I5A to the power-supply ground line subjected to the ground potential Vss. In this way, the constant-current sources I4A and I5A are connected to the junction between the differential amplifier 10A and the current mirror circuit 11A.

The transistors T3A and T2A compose a current mirror circuit which has a mirror ratio (a collector area ratio) "1:m". The transistors T4A and T5A compose a current mirror circuit which has a mirror ratio (a collector area ratio) "1:n". The constant-current sources I2A, I4A, I5A, and I6A are designed as follows. In the case where the output current from the constant-current source I4A is greater than the input current into the constant-current source I5A, the constant-current sources I2A, I4A, I5A, and I6A satisfy the following relations.

$$I4A-I5A<\{1/(1+m)\}I2A$$

$$(I4A-I5A)\times\beta_{T9A}>I6A \qquad (15A)$$

where "I2A" denotes the current outputted from the constant-current source I2A; "I4A" denotes the current outputted from the constant-current source I4A; "I5A" denotes the current inputted into or flowing through the constant-current source I5A; "I6A" denotes the current outputted from the constant-current source I6A; and "$\beta_{T9A}$" denotes a current-amplification factor of the transistor T9A as a grounded-emitter amplifier. In the case where the output current from the constant-current source I4A is smaller than the input current into the constant-current source I5A, the constant-current sources I2A, I4A, and I5A satisfy the following relation.

$$I5A-I4A<\{1/(1+n)\}I2A \qquad (15B)$$

The constant-current sources I2A, I7A, and I8A are designed as follows. In the case where the value "m" is greater than the value "n", the constant-current sources I2A, I7A, and I8A satisfy the following relation.

$$[\{n/(1+n)\}I2A-I7A]\cdot\beta_{T11A}>I8A \qquad (16A)$$

where "I7A" denotes the current inputted into or flowing through the constant-current source I7A, and "$\beta_{T11A}$" denotes a current-amplification factor of the transistor T11A as a grounded-emitter amplifier. In the case where the value "m" is smaller than the value "n", the constant-current sources I2A, I7A, and I8A satisfy the following relation.

$$[\{m/(1+m)\}I2A-I7A]\cdot\beta_{T11A}>I8A \qquad (16B)$$

where "I7A" denotes the current inputted into or flowing through the constant-current source I7A, and "$\beta_{T11A}$" denotes a current-amplification factor of the transistor T11A as a grounded-emitter amplifier.

A maximum common-mode input voltage $V_{ICMMAX}$ applied to each of the differential input terminals Vin(+) and Vin(−) is approximately expressed as follows.

$$V_{ICMMAX} \approx Vcc - V_{I2A} - V_{BET3A} - V_{BET1A} \qquad (17)$$

where "$V_{I2A}$" denotes the voltage across the constant-current source I2A; "$V_{BET1A}$" denotes the normal-direction bias voltage between the base and the emitter of the transistor T1A; and "$V_{BET3A}$" denotes the normal-direction bias voltage between the base and the emitter of the transistor T3A.

In the case where the constant-current source I2A uses a PNP transistor, the equation (17) is changed into the following version.

$$V_{ICMMAX} \approx Vcc - Vsatpnp - V_{BET3A} - V_{BET1A} \qquad (18)$$

where "Vsatpnp" denotes the saturation voltage between the collector and the emitter of the PNP transistor in the constant-current source I2A.

It is now assumed that a voltage $V_{ICM1}$ which exceeds the maximum voltage $V_{ICMMAX}$ by a voltage Vα is applied to each of the input terminals Vin(+) and Vin(−). In this case, the base voltage $V_{BT3A}$ of the transistor T3A is expressed as follows.

$$\begin{aligned}V_{BT3A} &= V20 + V_{BET1A} & (19)\\ &= V_{ICM1} + V_{BET1A}\\ &= V_{ICMMAX} + V\alpha + V_{BET1A}\\ &= Vcc - Vsatpnp - V_{BET3A} - V_{BET1A} + V\alpha + V_{BET1A}\\ &= Vcc - Vsatpnp - V_{BET3A} + V\alpha\end{aligned}$$

where "V20" denotes the voltage at the input terminal Vin(+). The emitter voltage $V_{ET3A}$ of the transistors T3A and T4A in the differential amplifier 10A is expressed as follows.

$$V_{ET3A} = Vcc - Vsatpnp \qquad (20)$$

The equations (19) and (20) indicate the following matter. In the case where the input voltage applied to each of the input terminals Vin(+) and Vin(−) exceeds a common-mode input voltage range (a given input voltage range or a normal input voltage range) whose upper limit equals the maximum voltage $V_{ICMMAX}$, the voltage $V_{BET3A}'$ between the base and the emitter of the transistor T3A is expressed by the following equations.

$$\begin{aligned}V_{BET3A}' &= V_{ET3A} - V_{BT3A} & (21)\\ &= V_{BET3A} - V\alpha < V_{BET3A}\end{aligned}$$

Equations similar to the equations (21) stand good for the transistor T4A. The equations (21) and the similar equations show that the voltage between the base and the emitter of each of the transistors T3A and T4A in the differential amplifier 10A disagrees with a normal bias when common-mode input voltages higher than the maximum voltage $V_{ICMMAX}$ are applied to the input terminals Vin(+) and Vin(−). Accordingly, in this case, the transistors T3A and T4A fall into off states or non-conductive states. Thus, the current mirror circuit 11A composed of the transistors T7A and T8A is not supplied with currents, and the transistors T7A and T8A fall into off states (non-conductive states). Since the base voltage of the transistor T9A is determined by the difference between the output current from the constant-current source I4A and the input current into the constant-current source I5A, the transistor T9A assumes either an on state (a conductive state) or an off state (a non-conductive state) in accordance with the current difference. If the transistor T9A assumes the on state, the transistor T10A falls into an off state (a non-conductive state) and hence a high-level voltage appears at the first output terminal OUT1. On the other hand, if the transistor T9A assumes the off state, the transistor T10A falls into an on state (a conductive state) and hence a low-level voltage appears at the first output terminal OUT1. The constant-current source I5A provides a reduced impedance of the line connected to the base of the transistor T9A. The reduced impedance is advantageous in preventing a signal from being contaminated by noise.

As previously described, in the case where input voltages which exceed the common-mode input voltage range are applied to the input terminals Vin(+) and Vin(−), the transistors T3A and T4A assume the off states. In this case, the transistor T2A which forms a current mirror in conjunction with the the transistor T3A also falls into an off state (a non-conductive state). In addition, the transistor T5A which forms a current mirror in conjunction with the transistor T4A falls into an off state (a non-conductive state).

The base voltage of the transistor T11A is determined by the constant-current source I7A. In the case where the constant-current source I7A uses an NPN transistor, the voltage $V_{BET11A}'$ between the base and the emitter of the transistor T11A is expressed as follows.

$$V_{BET11A}'=\text{Vsatnpn}<V_{BET11A} \quad (22)$$

where "Vsatnpn" denotes the saturation voltage between the collector and the emitter of the NPN transistor in the constant-current source I7A, and "$V_{BET11A}$" denotes the normal-direction bias voltage between the base and the emitter of the transistor T11A.

The equation (22) shows that the voltage between the base and the emitter of the transistor T11A is smaller than the normal-direction bias voltage between the base and the emitter thereof, and hence the transistor T11A falls into an off state or a non-conductive state. The transistor T12A is in an on state (a conductive state) when the transistor T11A is in the off state (the non-conductive state). Accordingly, in this case, the voltage at the second output terminal OUT2 assumes a low-level state. In summary, a low-level output signal is continuously transmitted via the second output terminal OUT2 in response to input voltages exceeding the common-mode input voltage range.

It is now assumed that input voltages applied to the input terminals Vin(+) and Vin(−) are in the common-mode input voltage range. In this case, since the voltage between the base and the emitter of at least one of the transistors T3A and T4A agrees with a normal-direction bias, the following relations are satisfied.

$$I2A = I_{CT2A} + I_{CT3A} + I_{CT4A} + I_{CT5A}$$

$$I_{CT2A} + I_{CT5A} = I2 - I_{CT3A} - I_{CT5A} \quad (23)$$

where "I2A" denotes the current outputted from the constant-current source I2A; "$I_{CT2A}$" denotes the collector current of transistor T2A; "$I_{CT3A}$" denotes the collector current of the transistor T3A; "$I_{CT4A}$" denotes the collector current of the transistor T4A; and "$I_{CT5A}$" denotes the collector current of the transistor T5A.

As previously described, the transistors T2A and T3A compose a current mirror. Also, the transistors T4A and T5A compose a current mirror. In consideration of the mirror ratios in these current mirrors, the equations (23) are modified into equations (24) and (25) indicated later. When the input voltage to the input terminal Vin(+) is greater than the input voltage to the input terminal Vin(−), the transistor T4A assumes an on state (a conductive state) and the transistor T3A assumes an off state (a non-conductive state) so that the following equation stands good.

$$I_{CT2A} + I_{CT5A} = \{n/(1+n)\}I2A \quad (24)$$

When the input voltage to the input terminal Vin(+) is smaller than the input voltage to the input terminal Vin(−), the transistor T3A assumes an on state (a conductive state) and the transistor T4A assumes an off state (a non-conductive state) so that the following equation stands good.

$$I_{CT2A} + I_{CT5A} = \{m/(1+m)\}I2A \quad (25)$$

Accordingly, when the input voltage to the input terminal Vin(+) is greater than the input voltage to the input terminal Vin(−), the base current $I_{BT11A}$ of the transistor T11A is expressed as follows.

$$I_{BT11A} = I_{CT2A} + I_{CT5A} - I7A \quad (26)$$

$$= \{n/(1+n)\}I2A - I7A$$

When the input voltage to the input terminal Vin(+) is smaller than the input voltage to the input terminal Vin(−), the base current $I_{BT11A}$ of the transistor T11A is expressed as follows.

$$I_{BT11A} = I_{CT2A} + I_{CT5A} - I7A \quad (27)$$

$$= \{m/(1+m)\}I2A - I7A$$

Since the constant-current source I7A satisfies the relations (16A) and (16B), the base current $I_{BT11A}$ of the transistor T11A enables the collector-emitter path of the transistor T11A to be conductive. Accordingly, in this case, the transistor T12A falls into an off state (a non-conductive state). Thus, the base current of the transistor T11A causes the voltage at the second output terminal OUT2 to assume a high-level state. In summary, a high-level output signal is transmitted via the second output terminal OUT2 in response to the input voltages within the common-mode input voltage range.

As previously described, when the input voltage to the input terminal Vin(+) is greater than the input voltage to the input terminal Vin(−), the transistor T4A assumes the on state and the transistor T3A assumes the off state. The transistor T8A falls into the off state In response to the off state of the transistor T3A. Therefore, an effective base current flows in the transistor T9A so that the transistor T9A assumes the on state. When the transistor T9A is in the on state, the transistor T10A is in the off state and hence a high-level voltage appears at the first output terminal OUT1. On the other hand, when the input voltage to the input terminal Vin(+) is smaller than the input voltage to the input terminal Vin(−), the transistor T3A assumes the on state and the transistor T4A assumes the off state. The transistor T8A falls into the on state in response to the on state of the transistor T3A. Therefore, an effective base current does not flow in the transistor T9A so that the transistor T9A assumes the off state. When the transistor T9A is in the off state, the transistor T10A is in the on state and hence a low-level voltage appears at the first output terminal OUT1. In summary, under conditions where input voltages to the input terminals Vin(+) and Vin(−) are in the common-mode input voltage range, the logic level of the voltage at the first output terminal OUT1 depends on whether the input voltage to the input terminal Vin(+) is smaller or greater than the input voltage to the input terminal Vin(−).

As understood from the previous description, the logic level of the voltage at the second output terminal OUT2 depends on whether or not input voltages to the input terminals Vin(+) and Vin(−) are in the common-mode output signal transmitted the output signal transmitted via the second output terminal OUT2 represents whether or not input voltages to the input terminals Vin(+) and Vin(−) are in the common-mode input voltage range.

A suitable detector may be provided to monitor the logic state of the output signal transmitted via the second output terminal OUT2. By referring to the monitored logic state of the output signal, it is possible to detect a malfunction of the transmission line such as a break of the transmission line.

Third Embodiment

Figure 3:
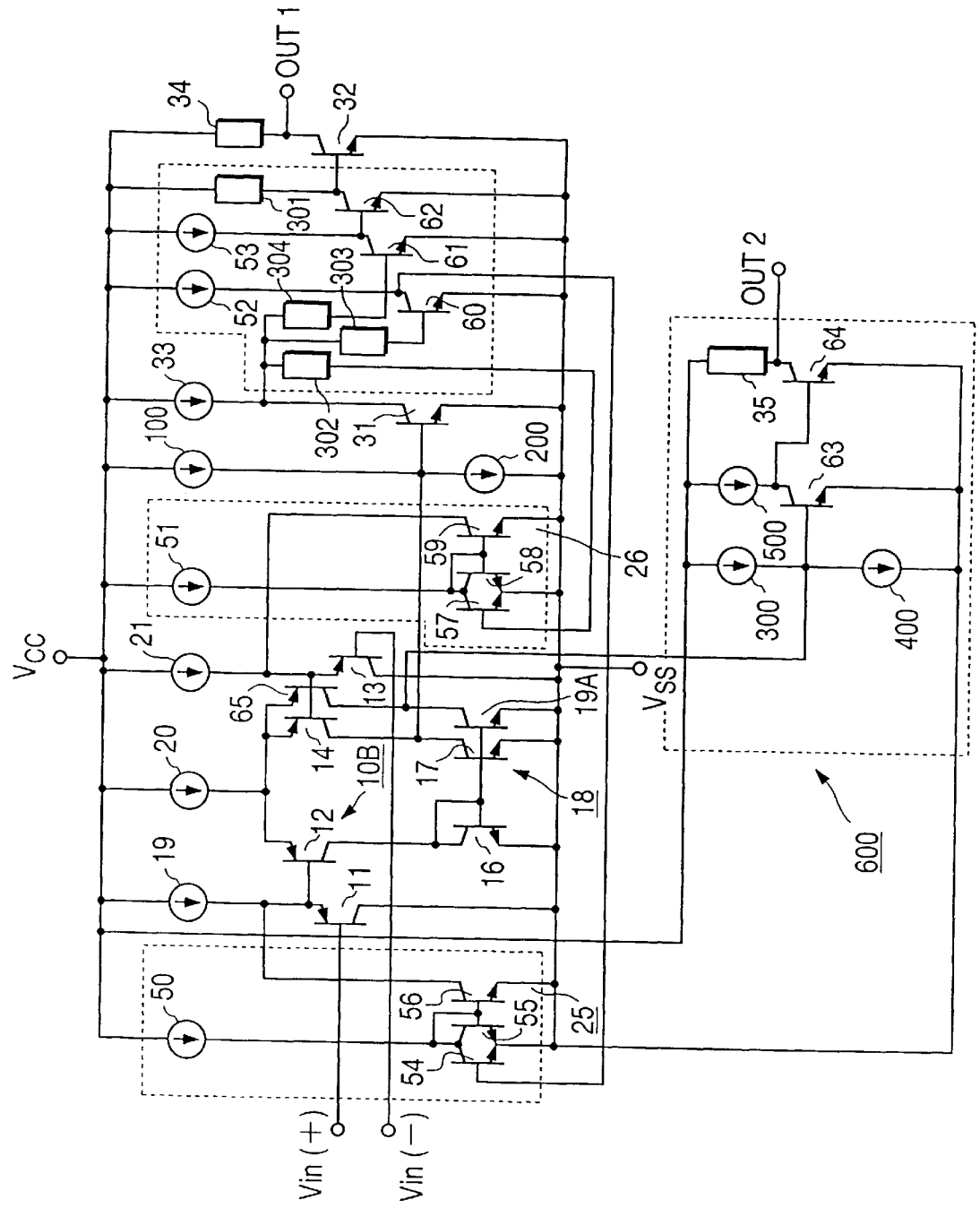
FIG. 3 is a schematic diagram of a data transmitter according to a third embodiment of this invention.

With reference to FIG. 3, a data transmitter includes a differential amplifier (a differential amplifier pair) 10B which has a pair of first and second sections. The first section of the differential amplifier 10B includes PNP transistors 11 and 12. The second section of the differential amplifier 10B includes PNP transistors 13, 14, and 65. The data transmitter of FIG. 3 is provided with NPN transistors 16, 17, and 19A.

The collector of the transistor 12 is connected to the collector of the transistor 16. The collector of the transistor 14 is connected to the collector of the transistor 17. The collector of the transistor 65 is connected to the collector of the transistor 19A. The collector of the transistor 16 is connected to the base thereof. The collector of the transistor 16 is also connected to the bases of the transistors 17 and 19A.

The emitters of the transistors 16, 17, and 19A are connected to a power-supply ground line subjected to a ground potential Vss. The transistors 16, 17, and 19A compose a current mirror circuit 18. The current mirror circuit 18 is connected to the differential amplifier 10B as a load.

The emitter of the transistor 11 is connected via a constantcurrent source (a current regulator) 19 to a positive power-supply line subjected to a positive power-supply voltage Vcc. The emitter of the transistor 13 is connected via a constant-current source (a current regulator) 21 to the positive power-supply line. The collectors of the transistors 11 and 13 are connected to the power-supply ground line subjected to the ground potential Vss.

The emitters of the transistors 12, 14, and 65 are connected in common. The emitters of the transistors 12, 14, and 65 are connected via a constant-current source (a current regulator) 20 to the positive power-supply line subjected to the positive power-supply voltage Vcc.

The emitter of the transistor 11 is connected to the base of the transistor 12. The emitter of the transistor 13 is connected to the bases of the transistors 14 and 65.

The data transmitter of FIG. 3 includes a pair of differential input terminals Vin(+) and Vin(−) connected to the bases of the transistors 11 and 13 in the differential amplifier 10B respectively.

Furthermore, the data transmitter of FIG. 3 includes NPN transistors 31, 32, 60, 61, and 62. A junction between the collector of the transistor 14 in the differential amplifier 10B and the collector of the transistor 17 in the current mirror circuit 11B is connected to the base of the transistor 31. The collector of the transistor 31 is connected via a constant-current source (a current regulator) 33 to the positive power-supply line subjected to the positive power-supply voltage Vcc. The emitter of the transistor 31 is connected to the power-supply ground line subjected to the ground potential Vss. Also, the collector of the transistor 31 is connected via an element 303 to the base of the transistor 60. Furthermore, the collector of the transistor 31 is connected via an element 304 to the base of the transistor 61. Each of the elements 303 and 304 includes, for example, a resistor or a constant-current source (a current regulator). The emitters of the transistors 60 and 61 are connected to the power-supply ground line subjected to the ground potential Vss. The collector of the transistor 60 is connected via a constant-current source (a current regulator) 52 to the positive power-supply line subjected to the positive power-supply voltage Vcc. The collector of the transistor 61 is connected via a constant-current source (a current regulator) 53 to the positive power-supply line. The collector of the transistor 61 is connected to the base of the transistor 62. The emitter of the transistor 62 is connected to the power-supply ground line subjected to the ground potential Vss. The collector of the transistor 62 is connected via an element 301 to the positive power-supply line subjected to the positive power-supply voltage Vcc. The element 301 includes, for example, a resistor or a constant-current source (a current regulator). The collector of the transistor 62 is connected to the base of the transistor 32. The emitter of the transistor 32 is connected to the power-supply ground line subjected to the ground potential Vss. The collector of the transistor 32 is connected via an element 34 to the positive power-supply line subjected to the positive power-supply voltage Vcc. The element 34 includes, for example, a resistor or a constant-current source (a current regulator). The collector of the transistor 32 is connected to a first output terminal OUT1.

In addition, the data transmitter of FIG. 3 includes NPN transistors 63 and 64. A junction between the collector of the transistor 65 in the differential amplifier 10B and the collector of the transistor 19A in the current mirror circuit 18 is connected to the base of the transistor 63. The emitter of the transistor 63 is connected to the power-supply ground line subjected to the ground potential Vss. The collector of the transistor 63 is connected via a constant-current source (a current regulator) 500 to the positive power-supply line subjected to the positive power-supply voltage Vcc. The collector of the transistor 63 is connected to the base of the transistor 64. The emitter of the transistor 64 is connected to the power-supply ground line subjected to the ground potential Vss. The collector of the transistor 64 is connected via an element 35 to the positive power-supply line subjected to the positive power-supply voltage Vcc. The element 35 includes, for example, a resistor or a constant-current source (a current regulator). The collector of the transistor 64 is connected to a second output terminal OUT2.

The base of the transistor 31 is connected via a constant-current source (a current regulator) 100 to the positive power-supply line subjected to the positive power-supply voltage Vcc. The base of the transistor 31 is connected via a constant-current source (a current regulator) 200 to the power-supply ground line subjected to the ground potential Vss.

The base of the transistor 63 is connected via a constant-current source (a current regulator) 300 to the positive power-supply line subjected to the positive power-supply voltage Vcc. The base of the transistor 63 is connected via a constant-current source (a current regulator) 400 to the power-supply ground line subjected to the ground potential Vss.

The transistors 63 and 64, the constant-current sources 300, 400, and 500, and the element 35 compose a circuit 600 for detection related to a common-mode input voltage range.

Furthermore, the data transmitter of FIG. 3 includes NPN transistors 54, 55, and 56. The collector of the transistor 60 is connected to the base of the transistor 54. The collectors of the transistors 54 and 55 are connected in common. The collectors of the transistors 54 and 55 are connected via a constant-current source (a current regulator) 50 to the positive power-supply line subjected to the positive power-supply voltage Vcc. The collectors of the transistors 54 and 55 are connected to the bases of the transistors 55 and 56. The collector of the transistor 56 is connected to the emitter of the transistor 11. The emitters of the transistors 54, 55, and 56 are connected to the power-supply ground line subjected to the ground potential Vss. The transistors 54, 55, and 56 compose a current mirror circuit 25.

In addition, the data transmitter of FIG. 3 includes NPN transistors 57, 58, and 59. The collector of the transistor 31 is connected via an element 302 to the base of the transistor 57. The element 302 includes, for example, a resistor or a constant-current source (a current regulator). The collectors of the transistors 57 and 58 are connected in common. The collectors of the transistors 57 and 58 are connected via a constant-current source (a current regulator) 51 to the positive power-supply line subjected to the positive power-supply voltage Vcc. The collectors of the transistors 57 and 58 are connected to the bases of the transistors 58 and 59. The collector of the transistor 59 is connected to the emitter of the transistor 13. The emitters of the transistors 57, 58, and 59 are connected to the power-supply ground line subjected to the ground potential Vss. The transistors 57, 58, and 59 compose a current mirror circuit 26.

In the case where the output current from the constant-current source 100 is greater than the input current into the constant-current source 200, the constant-current sources 20, 33, 100, and 200 are designed to satisfy the following relations.

$$I100 - I200 < I20$$

$$(I100 - I200) \times \beta 31 > I33 \tag{28A}$$

where "I20" denotes the current outputted from the constant-current source 20; "I33" denotes the current outputted from the constant-current source 33; "I100" denotes the current out-putted from the constant-current source 100; "I200" denotes the current inputted into or flowing through the constant-current source 200; and "β31" denotes a current-amplification factor of the transistor 31 as a grounded-emitter amplifier. In the case where the output current from the constant-current source 100 is smaller than the input current into the constant-current source 200, the constant-current sources 20, 100, and 200 are designed to satisfy the following relation.

$$I200 - I100 < I20 \tag{28B}$$

A maximum common-mode input voltage $V_{ICMMAX}$ applied to each of the differential input terminals Vin(+) and Vin(−) is approximately expressed as follows.

$$V_{ICMMAX} \approx Vcc - V_{20} - V_{BET12} - V_{BET11} \tag{29}$$

where "$V_{20}$" denotes the voltage across the constant-current source 20; "$V_{BET11}$" denotes the normal-direction bias voltage between the base and the emitter of the transistor 11; and "$V_{BET12}$" denotes the normal-direction bias voltage between the base and the emitter of the transistor 12.

In the case where the constant-current source 20 uses a PNP transistor, the equation (29) is changed into the following version.

$$V_{ICMMAX} \approx Vcc - Vsatpnp - V_{BET12} - V_{BET11} \tag{30}$$

where "Vsatpnp" denotes the saturation voltage between the collector and the emitter of the PNP transistor in the constant-current source 20.

It is now assumed that a voltage $V_{ICM1}$ which exceeds the maximum voltage $V_{ICMMAX}$ by a voltage Vα is applied to each of the input terminals Vin(+) and Vin(−). In this case, the base voltage $V_{B12}$ of the transistor 12 is expressed as follows.

$$V_{B12} = V22 + V_{BET11} \tag{31}$$

$$= V_{ICM1} + V_{BET11}$$

$$= V_{ICMMAX} + V\alpha + V_{BET11}$$

$$= Vcc - Vsatpnp - V_{BET12} - V_{BET11} + V\alpha + V_{BET11}$$

$$= Vcc - Vsatpnp - V_{BET12} + V\alpha$$

where "V22" denotes the voltage at the input terminal Vin(+). The emitter voltage $V_{E12}$ of the transistors 12 and 14 in the differential amplifier 10B is expressed as follows.

$$V_{E12} = Vcc - Vsatpnp \tag{32}$$

The equations (31) and (32) indicate the following matter. In the case where the input voltage applied to each of the input terminals Vin(+) and Vin(−) exceeds a common-mode input voltage range (a given input voltage range or a normal input voltage range) whose upper limit equals the maximum voltage $V_{ICMMAX}$, the voltage $V_{BET12}'$ between the base and the emitter of the transistor 12 is expressed by the following equations.

$$V_{BET12}' = V_{E12} - V_{B12} \tag{33}$$

$$= V_{BET12} - V\alpha < V_{BET12}$$

Equations similar to the equations (33) stand good for the transistor 14. The equations (33) and the similar equations show that the voltage between the base and the emitter of each of the transistors 12 and 14 in the differential amplifier 10B disagrees with a normal bias when common-mode input voltages higher than the maximum voltage $V_{ICMMAX}$ are applied to the input terminals Vin(+) and Vin(−). Accordingly, in this case, the transistors 12 and 14 fall into off states or non-conductive states. The transistor 65 also falls into an off state or a non-conductive state. Thus, the current mirror circuit 18 composed of the transistors 16, 17, and 19A is not supplied with currents, and the transistors 16, 17, and 19A fall into off states (non-conductive states). Since the base voltage of the transistor 31 is determined by the difference between the output current from the constant-current source 100 and the input current into the constant-current source 200, the transistor 31 assumes either an on state (a conductive state) or an off state (a non-conductive state) in accordance with the current difference. If the transistor 31 assumes the on state, the transistor 32 falls into an off state (a non-conductive state) as a result of operation of transistors 61 and 62 and hence a high-level voltage appears at the first output terminal OUT1. On the other hand, if the transistor 31 assumes the off state, the transistor 32 falls into an on state (a conductive state) and hence a low-level voltage appears at the first output terminal OUT1. The constant-current source 200 provides a reduced impedance of the line connected to the base of the transistor 31. The reduced impedance is advantageous in preventing a signal from being contaminated by noise.

The combination of the transistor 63 and the constant-current sources 300, 400, and 500 are similar to the combination of the transistor 31 and the constant-current sources 33, 100, and 200. Accordingly, in the case where the input voltage applied to each of the input terminals Vin(+) and Vin(−) exceeds the common-mode input voltage range, the base voltage of the transistor 63 is determined by the difference between the output current from the constant-current source 300 and the input current into the constant-current source 400. Thus, the transistor 63 assumes either an on state (a conductive state) or an off state (a non-conductive state) in accordance with the current difference. If the transistor 63 assumes the on state, the transistor 64 falls into an off state (a non-conductive state) and hence a high-level voltage appears at the second output terminal OUT2. On the other hand, if the transistor 63 assumes the off state, the transistor 64 falls into an on state (a conductive state) and hence a low-level voltage appears at the second output terminal OUT2. The constant-current source 400 provides a reduced impedance of the line connected to the base of the transistor 63. The reduced impedance is advantageous in preventing a signal from being contaminated by noise.

It is now assumed that input voltages applied to the input terminals Vin(+) and Vin(−) are in the common-mode input voltage range. In this case, the current mirror circuits 25 and 26 operate in an alternation manner in correspondence with operation of the differential amplifier 10B so that a highly-accurate hysteresis is provided.

Specifically, when the output current from the constant-current source 100 is greater than the input current into the constant-current source 200 and the input voltage V22 to the input terminal Vin(+) rises relative to the input voltage V23 to the input terminal Vin(−), a threshold voltage V22tr is approximately given as follows.

$$V22tr \approx V23 + V_T \ln\left(\frac{I21}{I19 - I51 \cdot m}\right) + V_T \ln\left(\frac{\alpha}{1-\alpha}\right) \quad (34)$$

where "α" is defined as "α={I20+(I100−I200)}/(2×I20)"; "$V_T$" is defined as "$V_T$=kT/q"; "q" denotes the charge of an electron; "k" denotes a Boltzmann constant; "T" denotes an absolute temperature; and "m" denotes an emitter area ratio between the transistors 58 and 59. On the other hand, when the input voltage V22 to the input terminal Vin(+) falls relative to the input voltage V23 to the input terminal Vin(−), a threshold voltage V22tf is approximately given as follows.

$$V22tf \approx V23 + V_T \ln\left(\frac{I21 - I50 \cdot n}{I19}\right) + V_T \ln\left(\frac{\alpha}{1-\alpha}\right) \quad (35)$$

where "n" denotes an emitter area ratio between the transistors 55 and 56.

According to the equations (34) and (35), a hysteresis voltage Vhys is approximately given as follows.

$$Vhys \approx V22tr - V22tf \quad (36)$$

$$\approx V_T \ln\left(\frac{I21}{I19 - I51 \cdot m} \cdot \frac{I19}{I21 - I50 \cdot n}\right)$$

The current I19 outputted from the constant-current source 19, the current I21 outputted from the constant-current source 21, the current I50 outputted from the constant-current source 50, the current I51 outputted from the constant-current source 51, and the emitter ratios "m" and "n" are suitably chosen by referring to the equation (36). Thereby, it is possible to accurately generate the hysteresis voltage Vhys.

When the output current from the constant-current source 100 is smaller than the input current into the constant-current source 200, it is also possible to accurately generate a hysteresis voltage.

Basic operation of the data transmitter of FIG. 3 in response to input voltages is similar to that of the data transmitter of FIG. 1.

Fourth Embodiment

Figure 4:
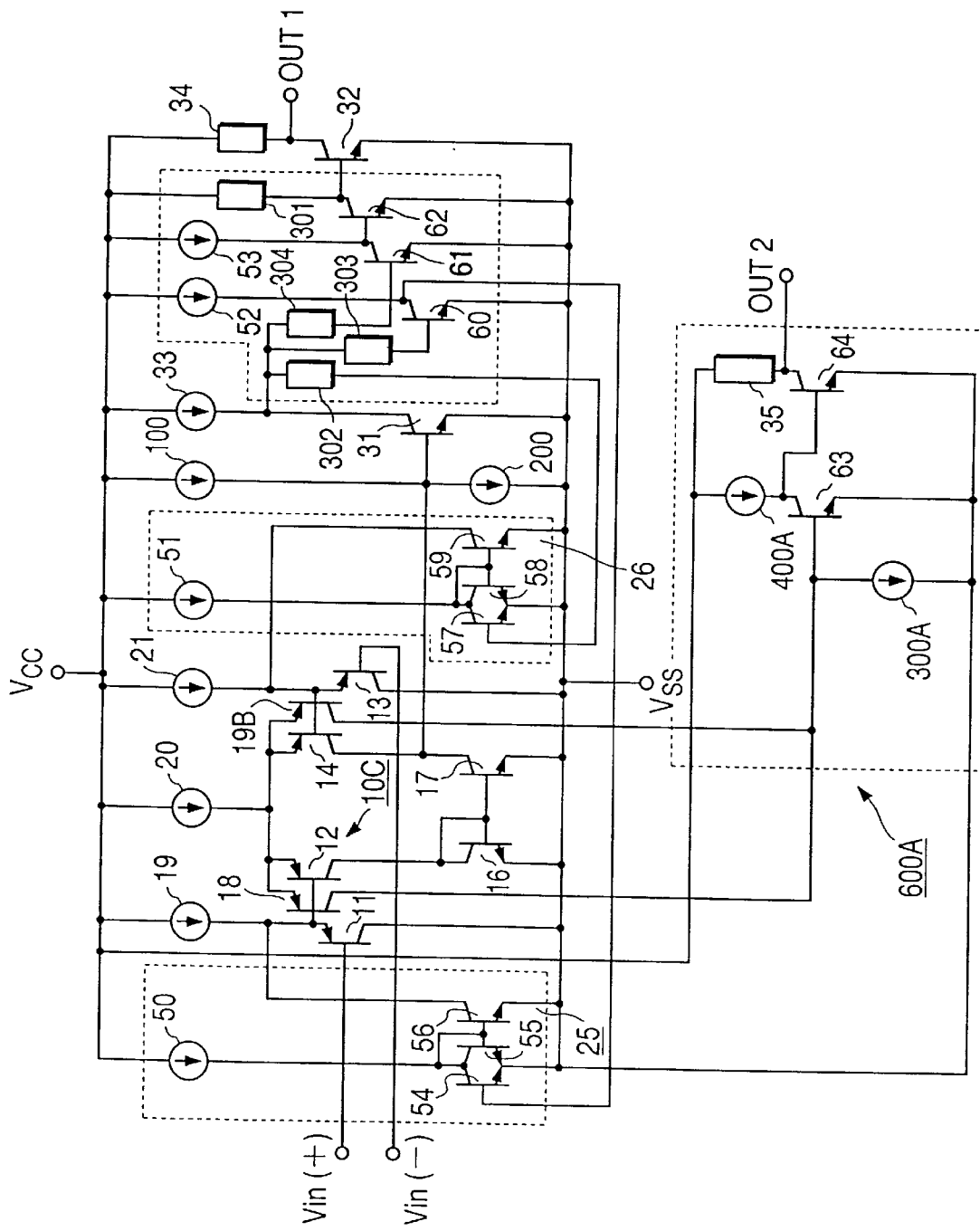
FIG. 4 is a schematic diagram of a data transmitter according to a fourth embodiment of this invention.

FIG. 4 shows a data transmitter according to a fourth embodiment of this invention. The data transmitter of FIG. 4 is similar to the data transmitter of FIG. 3 except for design changes indicated hereinafter. The data transmitter of FIG. 4 includes a differential amplifier 10C and a detection circuit 600A instead of the differential amplifier 10B and the detection circuit 600 in FIG. 3.

The differential amplifier 10C includes a PNP transistor 19B which replaces the transistor 65 in FIG. 3. The differential amplifier 10C includes a PNP transistor 18A. The emitter of the transistor 18A is connected to the emitter of a transistor 12. The base of the transistor 18A is connected to the base of the transistor 12.

The detection circuit 600A includes NPN transistors 63 and 64, constant-current sources (current regulators) 300A and 400A, and an element 35. The base of the transistor 63 is connected to the collectors of the transistors 18A and 19B. The base of the transistor 63 is connected via the constant-current source 300A to a power-supply ground line subjected to a ground potential Vss. The emitter of the transistor 63 is connected to the power-supply ground line. The collector of the transistor 63 is connected via the constant-current source 400A to a positive power-supply line subjected to a positive power-supply voltage Vcc. The collector of the transistor 63 is connected to the base of the transistor 64. The emitter of the transistor 64 is connected to the power-supply ground line subjected to the ground potential Vss. The collector of the transistor 64 is connected via the element 35 to the positive power-supply line subjected to the positive power-supply voltage Vcc. The collector of the transistor 64 is connected to an output terminal OUT2.

What is claimed is:

1. A differential-type data transmitter comprising:
   a differential amplifier pair including a plurality of transistors and receiving a pair of a first input signal and a second input signal;
   a load connected to the differential amplifier pair;
   detection means connected to a junction between the differential amplifier pair and the load for detecting whether or not the first and second input signals are outside a common-mode input voltage range with respect to the differential amplifier pair;
   first output means connected to the detection means for outputting a signal depending on an output signal from the differential amplifier pair, wherein the signal outputted from the first output means is set to a given level when the detection means detects that the first and second input signals are outside the common-mode input voltage range; and
   second output means connected to the detection means for outputting a detection signal representing whether or not the detection means detects that the first and second input signals are outside the common-mode input voltage range.

2. A differential-type data transmitter as recited in claim 1, wherein the detection means comprises:
   first detecting portion connected to the first output means; and a second detecting portion connected to the second output means;

wherein the first and second detecting portions output signals which are inverted with respect to each other when the first and second detecting portions detect that the first and second input signals are outside the common-mode input voltage range.

3. A differential-type data transmitter as recited in claim 2, further comprising:

a first transistor having a control terminal controlled by the first input signal, and a first output terminal and a second output terminal conduction-controlled by the control terminal thereof;

a second transistor having a control terminal controlled by the second input signal, and a first output terminal and a second output terminal conduction-controlled by the control terminal thereof;

a first load connected to the second output terminal of the first transistor;

a second load connected to the second output terminal of the second transistor;

a third transistor having a control terminal controlled by the second input signal, and a first output terminal and a second output terminal conduction-controlled by the control terminal thereof, wherein the first output terminal of the third transistor is connected to the first output terminal of the first transistor, and the control terminal of the third transistor is subjected to a signal depending on the second input signal; and a third load connected to the second output terminal of the third transistor;

wherein the first detecting portion is connected to a junction between the second output terminal of the second transistor and the second load, and the second detecting portion is connected to a junction between the second output terminal of the third transistor and the third load.

4. A differential-type data transmitter as recited in claim 3, wherein:

the first detecting portion includes a first detection transistor having a control terminal and two output terminals conduction-controlled by the control terminal thereof;

the second detecting portion includes a second detection transistor having a control terminal and two output terminals conduction-controlled by the control terminal thereof;

the control terminal of the first detection transistor is connected to a junction between the second output terminal of the second transistor and the second load;

the control terminal of the first detection transistor is connected to one end of a first constant-current circuit having another end connected to a high voltage power-supply terminal;

the first output means is controlled by an output signal from first detection transistor;

the control terminal of the second detection transistor is connected to a junction between the second output terminal of the third transistor and the third load;

the control terminal of the second detection transistor is connected to one end of a second constant-current circuit having another end connected to a low voltage power-supply terminal;

the second output means is controlled by an output signal from the second detection transistor;

the first detecting portion is operative for detecting that the first input signal and the second input signal are outside the common-mode input voltage range in cases where a voltage at the control terminal of the first detection transistor is determined by only a current of the first constant-current circuit; and the second detecting portion is operative for detecting that the first input signal and the second input signal are outside the common-mode input voltage range in cases where a voltage at the control terminal of the second detection transistor is determined by only a current of the second constant-current circuit.

5. A differential-type data transmitter comprising:

a first differential amplifier pair including a plurality of transistors and changing to and from an off state in response to a first input signal and a second input signal;

a second differential amplifier pair including a plurality of transistors and changing to and from an off state in response to the first input signal and the second input signal;

a load connected to the first differential amplifier pair;

first detection means connected to an output terminal of the first differential amplifier pair for detecting whether or not the first differential amplifier pair is in its off state;

second detection means connected to an output terminal of the second differential amplifier for detecting whether or not the second differential amplifier pair is in its off state;

first output means connected to the first detection means for outputting a signal depending on an output signal from the first differential amplifier pair, wherein the signal outputted from the first output means is set to a first given level when the first detection means detects that the first differential amplifier pair is in its off state; and second output means connected to the second detection means for outputting a signal depending on an output signal from the second differential amplifier pair, wherein the signal outputted from the second output means is set to a second given level when the second detection means detects that the second differential amplifier pair is in its off state.

6. A differential-type data transmitter as recited in claim 5, wherein the second detection means comprises a constant-current circuit, and the second detection means detects that the second defferential amplifier pair is in its off state in response to a difference between a current of the constant current circuit and a current caused by the second differential amplifier pair.

7. A differential-type data transmitter comprising:

a differential amplifier responding to a first input signal and a second input signal;

first means connected to the differential amplifier for generating a first output signal in response to the first and second input signals; and second means connected to the differential amplifier for generating a second output signal in response to the first and second input signals;

wherein a logic state of the first output signal and a logic state of the second output signal are equal to each other and depend on a difference between the first and second input signals when the first and second input signals are in a given voltage range; and wherein the logic state of the first output signal and the logic state of the second output signal are different from each other when the first and second input signals are outside the given voltage range.

* * * * *